United States Patent
Higashi et al.

(10) Patent No.: US 7,139,216 B2
(45) Date of Patent: Nov. 21, 2006

(54) SEMICONDUCTOR STORAGE DEVICE HAVING A COUNTER CELL ARRAY TO STORE OCCURRENCE OF ACTIVATION OF WORD LINES

(75) Inventors: Tomoki Higashi, Kanagawa (JP); Takashi Ohsawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/864,632

(22) Filed: Jun. 10, 2004

(65) Prior Publication Data

US 2005/0195680 A1  Sep. 8, 2005

(30) Foreign Application Priority Data

Mar. 2, 2004 (JP) ............... 2004-057703

(51) Int. Cl.
*G11C 8/00* (2006.01)
*G11C 11/34* (2006.01)

(52) U.S. Cl. ............... 365/236; 365/182; 365/222

(58) Field of Classification Search ........... 365/185.25, 365/222, 236
See application file for complete search history.

(56) References Cited

U.S. PATENT DOCUMENTS 5,251,177 A * 10/1993 Akamatsu et al. .......... 365/222
6,151,244 A * 11/2000 Fujino et al. ............... 365/149
6,373,758 B1 * 4/2002 Hughes et al. .............. 365/200
6,538,916 B1   3/2003 Ohsawa ...................... 365/149
6,567,330 B1   5/2003 Fujita et al. ................ 365/210
6,567,340 B1 * 5/2003 Nataraj et al. .............. 365/236
6,617,651 B1   9/2003 Ohsawa ...................... 257/366
6,654,286 B1 * 11/2003 Kawakami ............. 365/185.21
2005/0195680 A1   9/2005 Higashi et al.

OTHER PUBLICATIONS

S. Okhonin, et al., "Principles of Transient Charge Pumping on Partially Depleted SOI MOSFETs", IEEE Electron Device Letters, vol. 23, No. 5, May 2002, pp. 279-281.
U.S. Appl. No. 11/331,169, filed Jan. 13, 2006, Ohsawa.

* cited by examiner

Primary Examiner—Son Mai
(74) Attorney, Agent, or Firm—Oblon, Spivak, McClelland, Maier & Neustadt, P.C.

(57) ABSTRACT

A semiconductor storage device includes memory cells having a floating body region and storing data by accumulating or releasing electric charges in or from the floating body region; a memory cell array including a matrix arrangement of the memory cells; a plurality of word lines each connected to the memory cells of each row in the memory cell array; and a counter cell array including counter cells each provided in correspondence to each word line to store occurrences of activation of the word line to read out data from the memory cells.

14 Claims, 6 Drawing Sheets

LATCH CIRCUIT Ln

FIG. 3

HALF ADDER HAn

SEMICONDUCTOR STORAGE DEVICE HAVING A COUNTER CELL ARRAY TO STORE OCCURRENCE OF ACTIVATION OF WORD LINES

CROSS-REFERENCE TO RELATED APPLICATIONS

This application is based upon and claims the benefit of priority from the prior Japanese Patent Application No. 2004-57703, filed on Mar. 2, 2004, the entire contents of which are incorporated herein by reference.

BACKGROUND OF THE INVENTION

1. Field of the Invention

This invention relates to a semiconductor storage device.

2. Background Art

There is an FBC (Floating Body Cell) memory device as a semiconductor storage device expected to be a substitute of DRAMs. An FBC memory device has transistors formed on a SOI (Silicon On Insulator) substrate and having floating bodies (herein below, referred to as body regions as well), and stores data "1" or data "0" depending upon whether holes are stored in the body regions.

FBC memory cells comprising FETs (Field Effect Transistors) involve the problem of charge pumping phenomenon explained below (see "Principle of Transients Charge Pumping on Partially Depleted SOI MOSFETs" by S. Okhonin et al., IEEE Electron Device Letters, Vol. 23, No. 5, May 2002). In case the memory cells are N-type FETs, when a memory cell is ON, part of electrons in the inverted layer is trapped by the interfacial level along the interface between a gate oxide film and the body region. Holes stored heretofore in the body region recombine with these electrons and disappear. Therefore, while the memory cells are turned ON and OFF repetitively, holes stored in the body regions gradually decrease, and the state of data "1" undesirably changes to data "0".

Therefore, a semiconductor storage device, which is capable of preventing the charge pumping phenomenon by counting the number of activating times of word lines, is desired.

SUMMARY OF THE INVENTION

A semiconductor storage device according to an embodiment of the present invention comprises memory cells each having a floating body region and storing data by accumulating or releasing electric charges in or from the floating body region; a memory cell array including a matrix arrangement of said memory cells; a plurality of word lines each connected to said memory cells of each row in the memory cell array; and a counter cell array including counter cells each provided in correspond to each said word line to store occurrences of activation of the word line to read out data from the memory cells.

DETAILED DESCRIPTION OF THE INVENTION

Some embodiments of the invention will now be explained below with reference to the drawings. These embodiments, however, should not be construed to limit the invention.

(First Embodiment)

Figure 1:
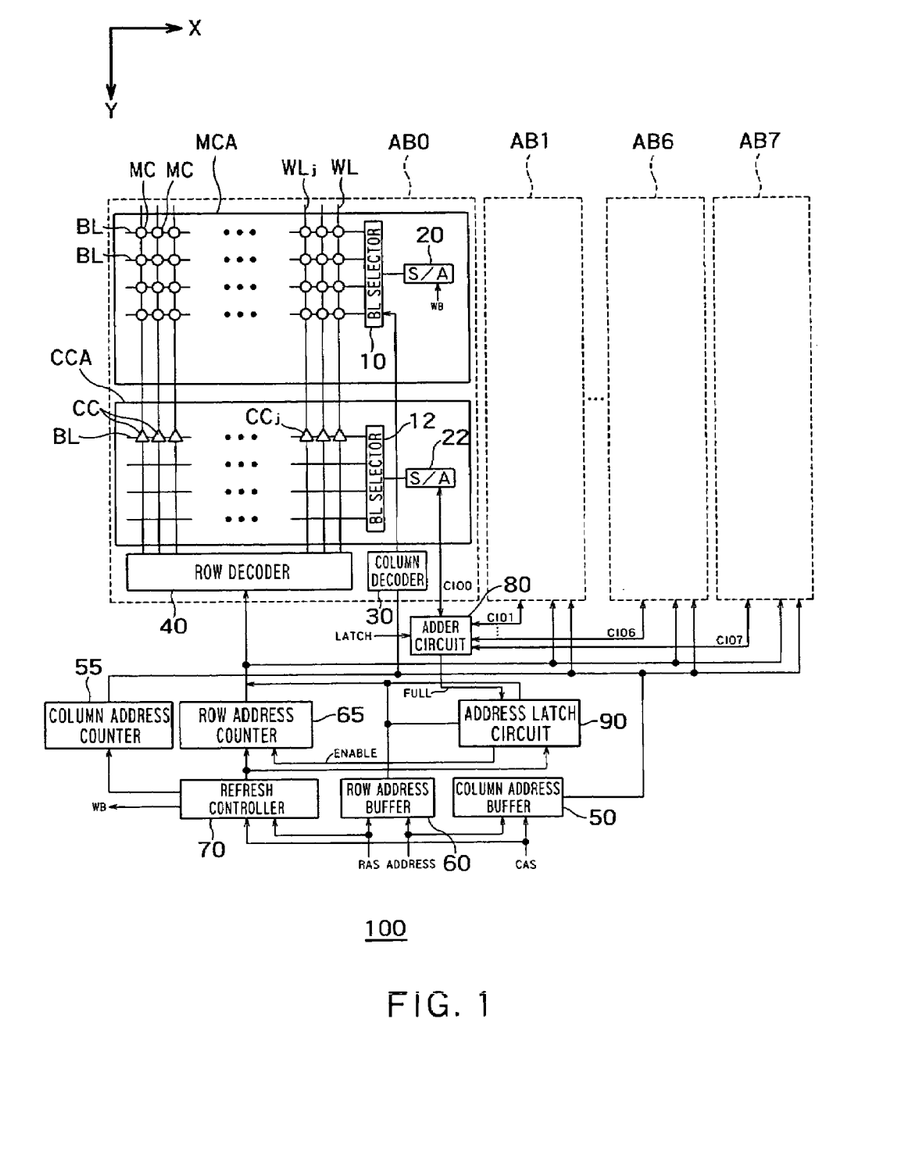
FIG. 1 is a block diagram of an FBC memory device 100 according to the first embodiment of the invention.

FIG. 1 is a block diagram of an FBC memory device 100 according to the first embodiment of the invention. The FBC memory device 100 includes array blocks AB0~AB7. The array blocks AB0~AB7 each includes a memory cell array MCA, counter cell array CCA, column decoder 30 and row decoder 40. The memory cell array MCA includes memory cells MC, bit line selectors 10, and sense amplifiers 20. The memory cells MC are in a matrix arrangement. Each memory cell MC includes a body region (not shown), and can store data by accumulating electric charge in the body region.

Drains of memory cells MC aligned along each column (X direction) are connected to a common bit line BL, and connected to the bit line selector 10 via the bit line BL. The bit line selector 10 can be connected to the sense amplifier 20 and the column decoder 30. Column decoders 30 of the individual array blocks AB0~AB7 are connected to a column address buffer 50. The column address buffer 50 transmits column address signals to the column decoders 30. In response to the column address signal, each column decoder 30 selects one of bit lines BL and connects the selected bit line to the sense amplifier 20.

Gates of memory cells MC aligned in each row (Y direction) are connected to a common word line WL, and connected to the row decoder 40 via the word line WL. The row decoders 40 of individual array blocks AB0~AB7 are connected to a row address buffer 60. The row address buffer 60 transmits row address signals to the row decoders 40. In response to the row address signal, each row decoder 40 selects one of word lines WL, and drives (activates) the selected word line.

In this manner, one bit line BL and one word line WL can be selected, and data can be written in or read out from the memory cell MC positioned at the crossing point of the bit line BL and the word line WL.

The column decoders 30 are connected to a column address counter 55, and the row decoders 40 are connected to a row address counter 65. The column address counter 55, row address counter 65 and sense amplifiers S/A are connected to a refresh controller 70. The refresh controller 70 controls the column address counter 55, row address counter 65 and sense amplifiers S/A upon refreshing memory cells MC. In this refresh operation, the column address counter 55 transmits a column address signal to have the bit line selector 10 select the bit lines BL sequentially. In the refresh operation, the row address counter 65 transmits a row address signal to have the row decoder 40 drive the word lines WL sequentially. Thus, the refresh operation can be executed for all of the memory cells MC in the memory cell array MCA.

The counter cell array CCA includes counter cells CC aligned along one column, a bit line selector 12 and a sense amplifier 22. The counter cells CC are associated with the respective word lines WL connected to the memory cells MC, and gates of the individual counter cells CC are connected to the respective word lines WL. That is, the memory cell array MCA and the counter cell array CCA are commonly connected to the word lines WL. Drains of the counter cells CC are connected to a bit line BL, and connected to an adder circuit 80. The counter cells CC may be identical in configuration to the memory cells MC, and can store data.

Drains of the counter cells CC in the respective array blocks AB0~AB7 are connected to an adder circuit 80. The adder circuit 80 reads data from each of the array blocks AB0~AB7, which data correspond to a word line WLj at a certain address activated in a reading operation. Thus, the adder circuit 80 obtains one-bit data from each of the array blocks AB0~AB7, which becomes data of eight bits in total. Then, the adder circuit 80 combines data from the array blocks AB0~AB7 to generate a digital value N of eight bits, and adds 1 to the digital value N to produce the digital value N+1. Further, the adder circuit 80 writes the data of individual bits of the digital value N+1 back to counter cells CCk at the same row addresses of the individual array blocks AB0~AB7. This counting operation is repeated every time when the first address word line WL is activated upon read operation. As a result, each counter cell array CCA can store the number of the activating the word line WL at each address, that is, the number of the read occurrences of the individual row addresses. When the digital value N reaches the maximum value, the adder circuit 80 transmits a full signal FULL to an address latch circuit 90.

For example, if the word line WL at a first row address has never been activated, the digital value N is "00000000". One (1) is added to N every time when read operation from the first address is executed, and the digital value N reaches the maximum value "11111111" when read operation is executed 256 times. Therefore, the counter cell array CCA can count 256 times of read operation for each word line WL. When the word line WL at the same row address is next activated, the adder circuit 80 returns the digital value N to "00000000" and simultaneously transmits the full signal FULL to the address latch circuit 90. Configuration of the adder circuit 80 is explained in detail with reference to FIG. 2.

The address latch circuit 90 is connected to the adder circuit 80, row decoder 40, row address buffer 60, row address counter 65 and refresh controller 70. When the address latch circuit 90 receives the full signal FULL from the adder circuit 80, it acquires the currently selected row address from the row address buffer 60, and stores this row address. After that, when refresh operation is executed, the address latch circuit 90 transmits an enable signal ENABLE to the row address counter 65, and simultaneously transmits the row address stored in the row decoder 40. In this manner, the row address stored in the address latch circuit 90 can be sent to the row decoder 40 instead of the row address stored in the row address counter 65. Upon later refresh operation, the semiconductor storage device 100 preferentially refresh the most frequently activated memory cell MC after a full round of the digital value N. Herein below, this refresh operation is called "preferential refresh" as well.

Figure 2:
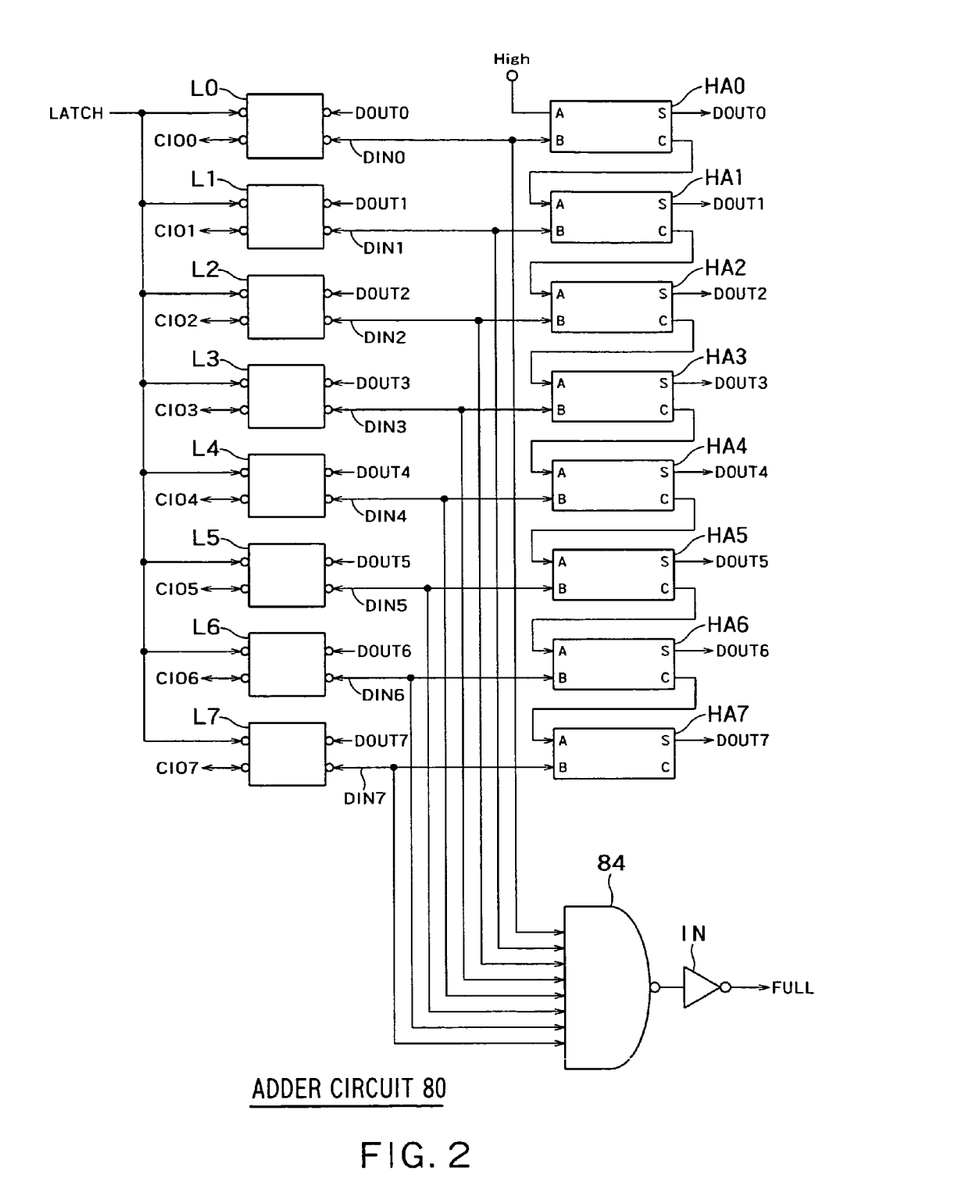
FIG. 2 is a circuit diagram showing an exemplary configuration of an adder circuit 80.

FIG. 2 is a circuit diagram showing exemplary configuration of the adder circuit 80. The adder circuit 80 includes latch circuits Ln (n=0~7), half adders HAn (n=0~7), NAND circuit 84, and inverter IN.

Figure 3:
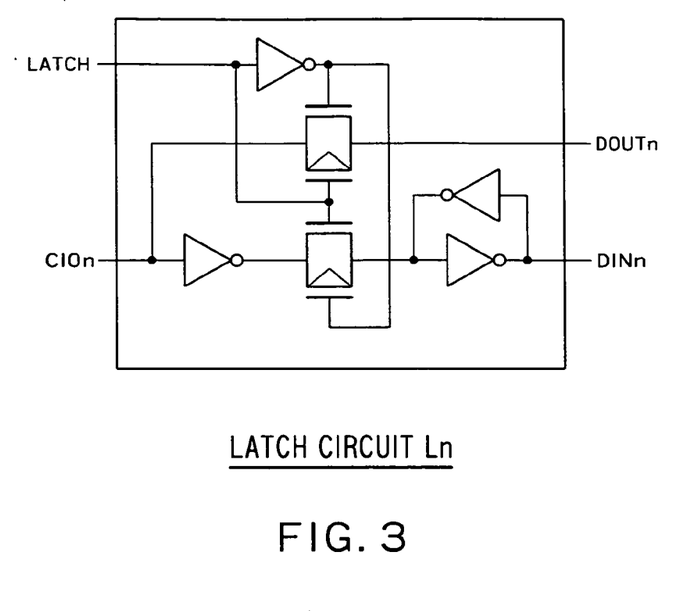
FIG. 3 is a circuit diagram showing an exemplary configuration of a latch circuit Ln.

The latch circuits Ln may be of any type, such as one of conventional configurations shown in FIG. 3, for example. The latch circuits Ln have counter IN/OUT ports CIOn (n=0~7) capable of introducing data from the counter cell CC, and latch the data of the counter cell CC input from the counter IN/OUT ports CIOn in response to a latch signal LATCH. This data constitutes the digital value N of 8 bits, and it is transmitted as input data DINn (n=0~7) to the half adders HAn. The data is next added with 1 by the half adders HAn, and it is sent back as output data DOUTn (n=0~7) to the latch circuits Ln. This output data DOUTn is written in the counter cell CC through the counter IN/OUT ports CIOn.

Figure 4:
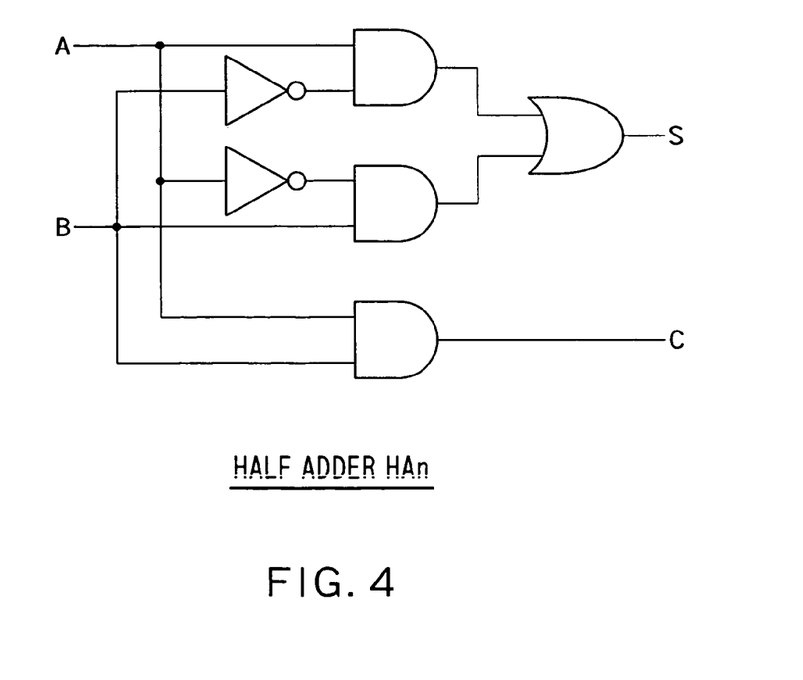
FIG. 4 is a circuit diagram showing an exemplary configuration of a half adder HAn.

The half adders HAn may be of any type, such as one of conventional configurations shown in FIG. 4, for example. The half adders HAn add binary one-digit data introduced from terminal A and B, and output the sum S and the carry C. The half adders HAn introduce the input data DINn from the latch circuits Ln through the terminals B, and introduce the carry C through the terminals A. Since the half adder HA0 for introducing the least significant bit (input data DIN0) of the digital value N introduces HIGH through the terminal A, one (1) is added to the input data DIN0. As a result, the input data DINn forming the digital value N is output as output data DOUTn forming the digital value N+1.

The input data DINn is input to the NAND circuit 84 as well. When all bits of the input data DINn are "1", that is, if the digital value N is "11111111", the full signal FULL to the address latch circuit 90 can be established. The adder circuit 80 shown in FIG. 2 may be modified in various forms for practical use.

Figure 5:
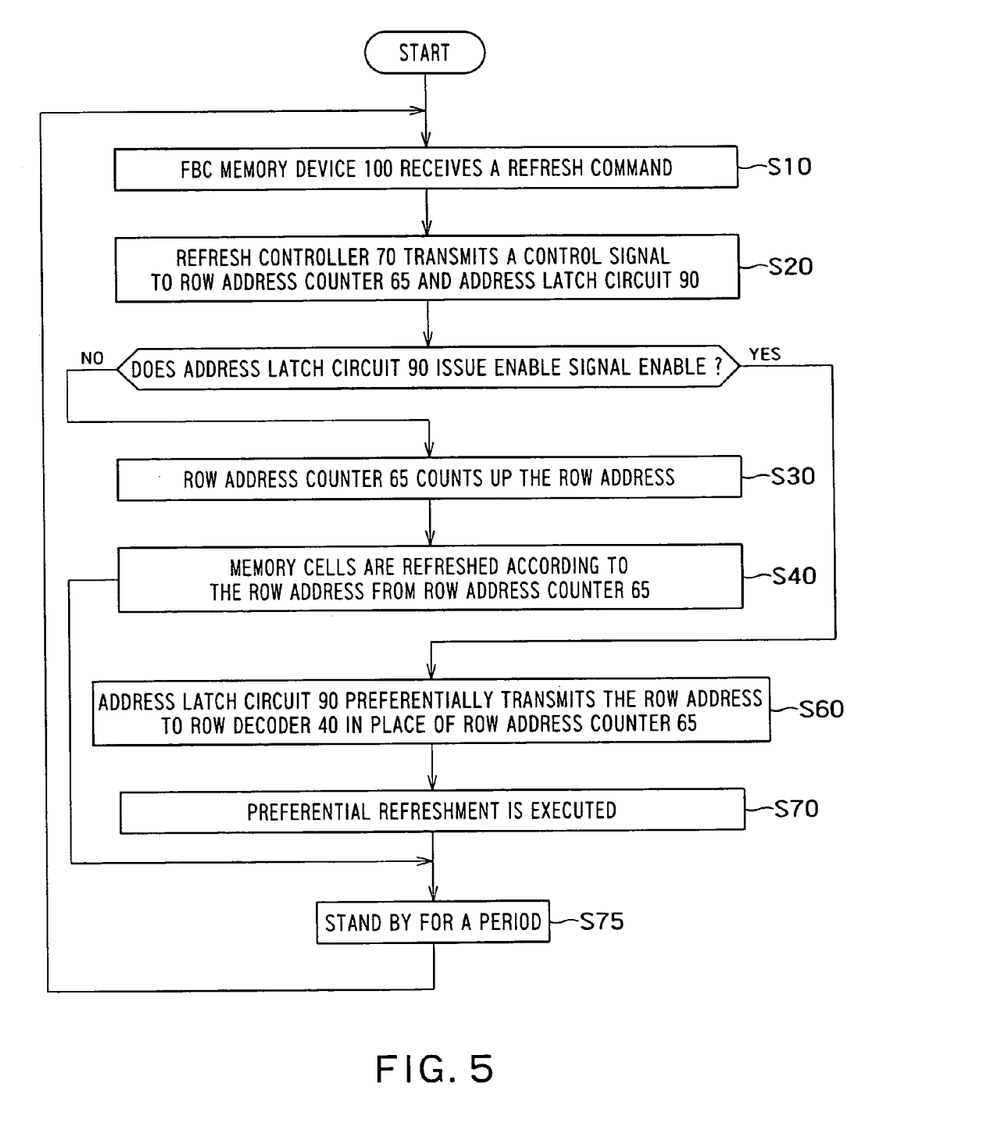
FIG. 5 is a flow chart showing procedures of refresh operation of the first embodiment.

FIG. 5 is a flow chart showing procedures of refresh operation of the first embodiment. The refresh operation reads out data of a memory cell MC once; then latches the data; and again writes the data in the same memory cell MC.

First, the FBC memory device 100 receives a refresh command from an external memory controller (not shown) (S10). This refresh command may be a so-called "CAS before RAS" that transmits a RAS signal before a CAS signal. In response to the refresh command, the refresh controller 70 transmits a control signal to the row address counter 65 and the address latch circuit 90 (S20).

At that time, if the address latch circuit 90 does not currently issue the enable signal ENABLE, then the row address counter 65 counts up the row address according to the regular procedure (S30). Based on the row address from the row address counter 65, memory cells MC are refreshed (S40). In the refresh operation, memory cells at one row address are refreshed by each refresh command, and the regular refresh operation is executed in the order of addresses. As a result, memory cells MC at all row addresses are refreshed sequentially.

In case the address latch circuit 90 currently issues the enable signal ENABLE, then the row address counter 65 does not transmits the row address. Instead, the address latch circuit 90 preferentially transmits the row address to the row decoder 40 (S60). The row address generated in the row address counter 65 is transmitted to the row decoder 40 upon the next refreshment. Thus, preferential refreshment is executed (S70). In the refresh operation, the digital value N is not counted up.

Then, the refresh operation is suspended for a predetermined time (S75), and thereafter, it is executed again from step S10. As such, the FBC memory device 100 executes the refresh operation periodically.

The first embodiment counts the occurrences of activation of the word lines by way of the digital value N, and can preferentially refresh the memory cells MC connected to the word line at the row address when the digital value N makes a full round. Therefore, the first embodiment can prevent the charge-pumping phenomenon.

Although the first embodiment executes the preferential refresh operation after each full round of the 8-bit digital value N, it may be modified to execute it after each full round of a digital value of seven bits or less. For example, the counter cell array CCA is not provided in the array block AB7, but it is provided only in the array blocks AB0~AB6 respectively. Further, the latch circuit and the half adder HA7 shown in FIG. 2 are omitted. Thus, the FBC memory device 100 can execute the preferential refresh operation upon each full round of the 7-bit digital value N. Alternatively, the array blocks ABn may be increased, and the FBC memory device 100 may execute the preferential refresh operation upon each full round of a digital value N of nine bits or more. However, the maximum value of the digital value N should be smaller than the occurrences of activation of the word line WL, which lead to a malfunction by the charge-pumping phenomenon.

(Second Embodiment)

Figure 6:
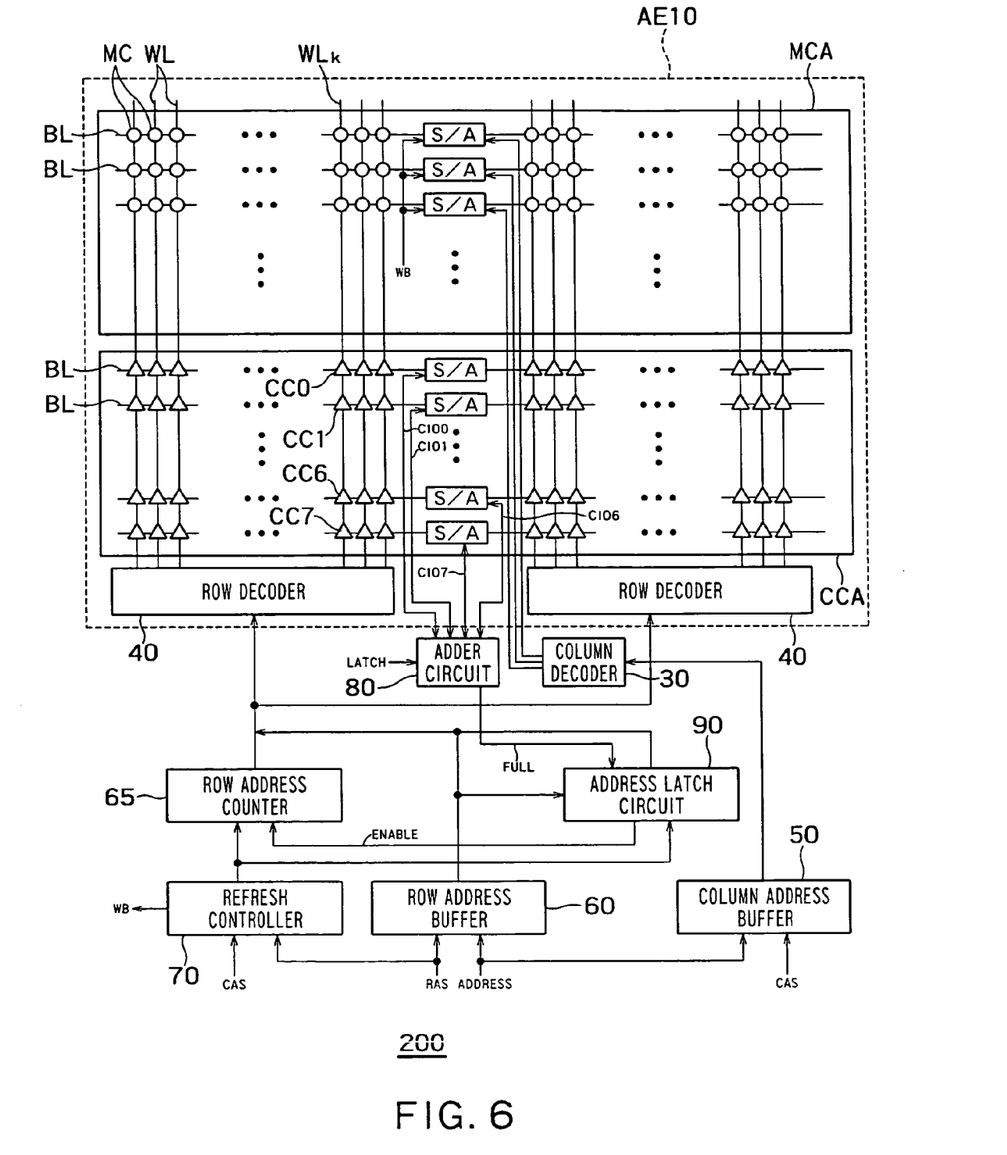
FIG. 6 is a block diagram of an FBC memory device 200 according to the second embodiment.

FIG. 6 is a block diagram showing an FBC memory device 200 as a semiconductor storage device according to the second embodiment of the invention. The FBC memory device 200 includes an array block AB10. The array block AB10 has a memory cell array MCA, counter cell array CCA and row decoder 40.

The memory cell array MCA in the second embodiment includes a matrix arrangement of memory cells MC similarly to the first embodiment. In the second embodiment, however, the memory cell array MCA is different from the first embodiment in that the memory cell array MCA has an open bit type configuration and has sense amplifiers S/A each allocated to every adjacent bit line BL. The open bit type configuration pertains to a structure connecting each sense amplifier to a pair of bit lines on a common column extending at opposite sides thereof.

The counter cell array CCA in the second embodiment is different from the first embodiment in that the counter cell array CCA includes counter cells CC aligned along a plurality of columns and includes sense amplifiers S/A associated respectively with individual columns. The counter cell array CCA has an open bit type configuration similarly to the memory cell array MCA.

The adder circuit 80 is connected to individual sense amplifiers S/A in one counter cell array CCA. Individual sense amplifiers S/A read data from counter cells on all columns connected to a word line WL at a certain activated row address, and transmit the data to the adder circuit 80. The adder circuit 80 combines these data from the individual sense amplifiers S/A and generates the digital value N. After that, the adder circuit 80 executes counting operation similarly to the adder circuit of the first embodiment. In addition, the adder circuit 80 writes the individual bit data of the digital value N+1 back to the counter cells CC. In this manner, the counter cell array CCA can store the activated occurrences of the word lines WL at the respective row addresses.

For example, when the word line WLk at a certain row address shown in FIG. 6 is activated, the adder circuit 80 acquires one-bit data from each of the counter cells CC0~CC7 connected to the word line WLk, which becomes data of eight bits in total. The adder circuit 80 next combines the data from the counter cells CC0~CC7 to generate a digital value N of eight bits, and adds 1 to the digital value N to produce the digital value N+1. Further, the adder circuit 80 writes the digital value N+1 back to the counter cells CC0~CC7. The refresh operation of the second embodiment is substantially the same as that of the first embodiment. Its explanation is therefore omitted here.

The second embodiment demonstrates the same effects as those of the first embodiment. The second embodiment, can store the activated occurrences of word lines WL in the single counter cell array CCA. Since the second embodiment is applicable to memory devices having an open bit line configuration and allocates each sense amplifier S/A to each column (each bit line BL), it can refresh all memory cells connected to a certain word line WL in one stroke, As a result, it can reduce the time required from the refresh operation.

FIG. 6 illustrates only one array block AB10. However, two or more array blocks may be provided. In this case, each array block must have its own adder circuit 80 and address latch circuit 90.

In the first and second embodiments, the address latch circuit 90 may be so configured that it can latch a plurality of row addresses. Then, if the adder circuit 80 issues a full signal FULL for a plurality of row addresses, the address latch circuit 90 can latch these row addresses. In this case, the plurality of row addresses latched by the address latch circuit 90 are refreshed preferentially.

(Third Embodiment)

Figure 7:
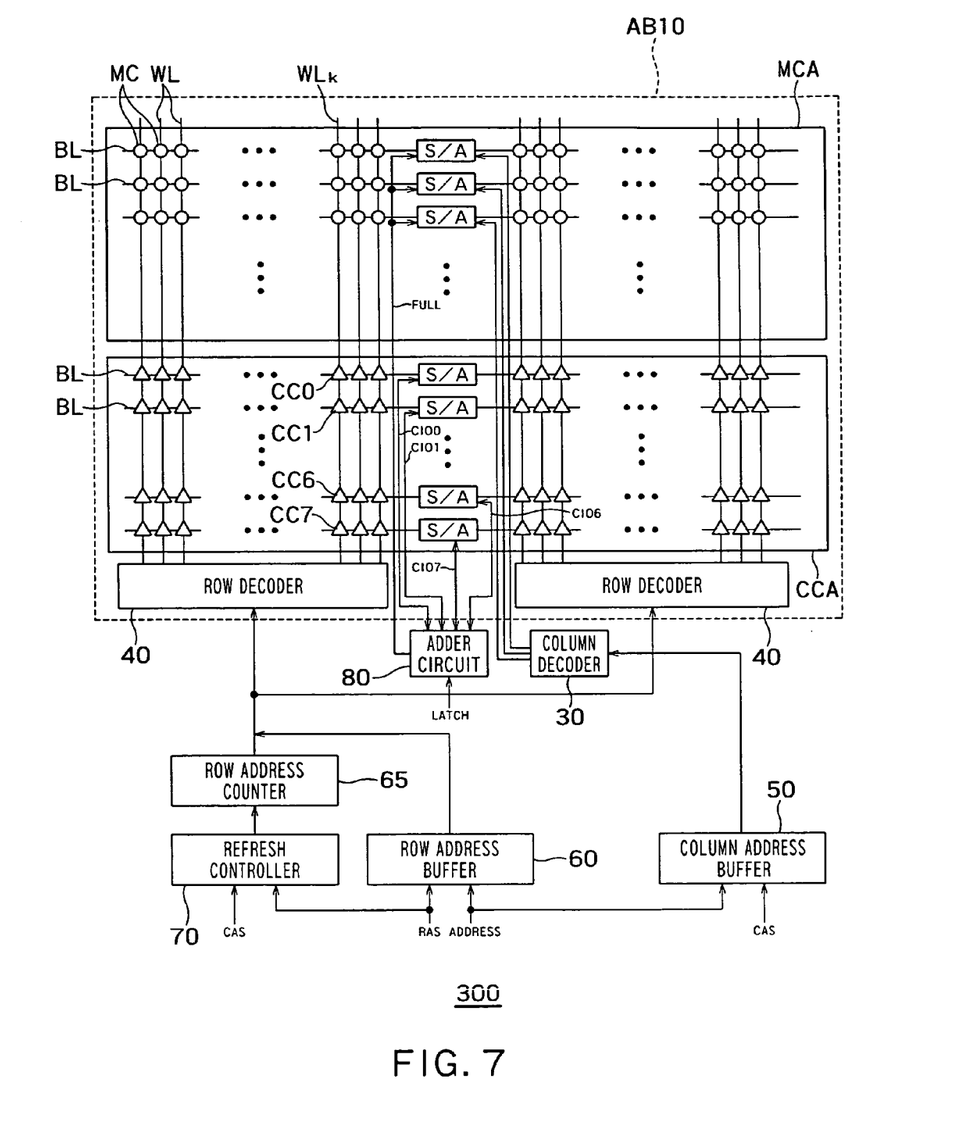
FIG. 7 is a block diagram of an FBC memory device 300 according to the third embodiment.

FIG. 7 is a lock diagram showing an FBC memory device 300 as a semiconductor storage device according to the third embodiment of the invention. The FBC memory device 300 includes an array block AB10. Configuration of the array block AB10 may be like the second embodiment. That is, the memory cell array MCA and the counter cell array CCA have open bit configurations.

The third embodiment is different from the second embodiment in not having the address latch circuit 90 and connecting the adder circuit 80 directly to the sense amplifiers S/A in the memory cell array MCA. The third embodiment executes preferential refreshment every time when the digital value makes a full round, without waiting a refresh command. That is, since the FBC memory device 300 need not store the row address until receiving a refresh command, it does not require the address latch circuit 90. In addition, although the FBC memory device 300 needs the refresh controller 70 in the ordinary periodical refresh operation, but does not need it for preferential refreshment.

For example, when the word line WLk at a certain row address shown in FIG. 7 is activated, the adder circuit 80 acquires one-bit data from each of the counter cells CC0~CC7 connected to the word line WLk, which becomes data of eight bits in total. The adder circuit 80 next combines data from the counter cells CC0~CC7 to generate a digital value N of eight bits, and adds 1 to the digital value N to produce the digital value N+1. Further, the adder circuit 80 writes the digital value N+1 back to the counter cells CC0~CC7.

After the digital value N reaches the maximum value "11111111", if the word line of the same row address is next activated, the adder circuit 80 sets back the digital value N "00000000" and transmits the full signal FULL as a refresh signal to the sense amplifiers S/A in the memory cell array MCA. In receipt of the full signal FULL, the sense amplifiers S/A refresh all memory cells connected to the word line WLk. As such, the third embodiment executes preferential refreshment at the time when the digital value N makes a full round.

The third embodiment has the same effects as those of the second embodiment. Further, the third embodiment, not having the address latch circuit 90 shown in FIG. 6, can reduce the area of the peripheral circuit or logic circuit even more than the second embodiment.

FIG. 7 illustrates only one array block AB10. However, two or more array blocks may be provided. In this case, each array block must have its own adder circuit 80.

What is claimed is:

1. A semiconductor storage device comprising:
   memory cells having a floating body region and storing data by accumulating or releasing electric charges in or from the floating body region;
   a memory cell array including a matrix arrangement of said memory cells;
   a plurality of word lines each connected to said memory cells of each row in the memory cell array; and
   a counter cell array including a plurality of counter cells provided for each said word line, each said counter cell storing 1-bit data, and a plurality of said 1-bit data from each of the counter cells producing a digital value of activation occurrences of the word line to read out data from the memory cells.

2. A semiconductor storage device according to claim 1 further comprising:
   a plurality of array blocks including said memory cell array and said counter cell array;
   an adder circuit acquiring data of said counter cells, which are connected to an activated word line of a row, from respective said array blocks and making an increment of a digital value of these data each time upon activation of said word line; and
   an address latch circuit storing the address of said row upon each full round of said digital value.

3. A semiconductor storage device according to claim 1 further comprising:
   a plurality of bit lines connected to counter cells of each column of said counter cell array;
   an adder circuit acquiring data of said counter cells, which are connected to an activated word line of a row, from respective said bit lines and making an increment of a digital value of these data each time upon activation of said word line; and
   an address latch circuit storing the address of said row upon each full round of said digital value.

4. A semiconductor storage device according to claim 1 further comprising:
   a plurality of first bit lines connected to memory cells aligned in each column of said memory cell array;
   first sense amplifiers associated with each said first bit line;
   a plurality of second bit lines connected to the counter cells aligned in each column of said counter cell array;
   second sense amplifiers associated with each said second bit line; and
   an adder circuit acquiring data of said counter cells, which are connected to an activated word line of a row, from respective said second bit lines and making an increment of a digital value of these data each time upon activation of said word line, said adder circuit transmitting a refresh signal upon each full round of said digital value to said first sense amplifiers to refresh the memory cells in each said row of the array block.

5. A semiconductor storage device according to claim 2 further comprising:
   a row decoder activating word lines of a certain row address; and
   a row address counter transmitting to said row decoder the address of a certain row of said memory cells to be refreshed,
   wherein, if said digital value for any of said rows has already made a full round upon refreshment of said memory cells, said address latch circuit transmits the address stored in the storage thereof to said row decoder in place of said row address counter.

6. A semiconductor storage device according to claim 3 further comprising:
   a row decoder activating word lines of a row address; and
   a row address counter transmitting to said row decoder the address of a certain row of said memory cells to be refreshed,
   wherein, if said digital value for any of said rows has already made a full round upon refreshment of said memory cells, said address latch circuit transmits the address stored in the storage thereof to said row decoder in place of said row address counter.

7. A semiconductor storage device according to claim 2, wherein
   the address latch circuit latches addresses of a plurality of the rows, said digital values of the plurality of the rows already making a full round.

8. A semiconductor storage device according to claim 3, wherein
   the address latch circuit latches addresses of a plurality of the rows, said digital values of the plurality of the rows already making a full round.

9. A semiconductor storage device according to claim 2, wherein refresh operations of the memory cells are executed periodically.

10. A semiconductor storage device according to claim 3, wherein refresh operations of the memory cells are executed periodically.

11. A semiconductor storage device according to claim 2, wherein if none of the digital values for said rows has already made a full round upon refreshment of said memory cells, refresh operations are executed in the order of addresses of the rows in the memory cell array.

12. Semiconductor storage device according to claim 3, wherein if none of the said digital values for said rows has already made a full round upon refreshment of said memory cells, refresh operations are executed in the order of addresses of the rows in the memory cell array.

13. A semiconductor storage device according to claim 4, wherein if none of the said digital values for said rows has already made a full round upon refreshment of said memory cells, refresh operations are executed in the order of addresses of the rows in the memory cell array.

14. A semiconductor storage device according to claim 5, wherein if none of the said digital values for said rows has already made a full round upon refreshment of said memory cells, refresh operations are executed in the order of addresses of the rows in the memory cell array.

* * * * *